United States Patent
Hsieh et al.

[11] Patent Number: 6,046,097
[45] Date of Patent: Apr. 4, 2000

[54] DEPOSITION METHOD WITH IMPROVED STEP COVERAGE

[75] Inventors: Kevin Hsieh, Hsin-Chu Hsien; Kun-Chih Wang, Tao-Yuan; Wen-Yi Hsieh, Hsin-Chu, all of Taiwan

[73] Assignee: United Microelectronics Corp., Hsin-Chu, Taiwan

[21] Appl. No.: 09/274,599

[22] Filed: Mar. 23, 1999

[51] Int. Cl.$^7$ .................................................. H01L 21/28
[52] U.S. Cl. ........................... 438/584; 438/637; 438/761
[58] Field of Search ..................... 438/584, 597, 438/627, 628, 629, 637, 758, 761

[56] References Cited

U.S. PATENT DOCUMENTS

| | | | |
|---|---|---|---|
| 4,337,115 | 6/1982 | Ikeda et al. | 438/670 |
| 5,084,412 | 1/1992 | Nakasaki | 438/656 |
| 5,525,158 | 6/1996 | Tsukazaki et al. | 118/723 |
| 5,529,634 | 6/1996 | Miyata et al. | 118/726 |
| 5,561,326 | 10/1996 | Ito et al. | 257/751 |
| 5,824,562 | 10/1998 | Park et al. | 438/637 |

Primary Examiner—T. N. Quach
Attorney, Agent, or Firm—Harness, Dickey & Pierce, P.L.C.

[57] ABSTRACT

A deposition method for improving the step coverage of contact holes is disclosed. The method includes initially placing a semiconductor substrate on a chuck of a chamber, wherein the substrate has some contact holes. The chuck is firstly adjusted and conductive material is firstly deposited onto the substrate, wherein the direction of the first deposition is about vertical to the surface of the substrate, and therefore the bottom of the contact holes is then substantially deposited with the conductive material. Next, the chuck is secondly adjusted so that it has a tilt angle between the direction of the second deposition and rotation axis of the chuck. Finally, the chuck is continuously rotated and the conductive material is secondly deposited onto the substrate, and therefore the sidewall of the contact holes is then substantially deposited with the conductive material.

7 Claims, 5 Drawing Sheets

DEPOSITION METHOD WITH IMPROVED STEP COVERAGE

BACKGROUND OF THE INVENTION

1. Field of the Invention

The present invention relates to a deposition method, and more particularly, to a method of physical vapor deposition with substantially good step coverage on the bottom and the sidewall in the contact holes.

2. Description of the Prior Art

Physical vapor deposition (PVD) is one of deposition methods frequently used in the modern semiconductor industry. For example, the barrier layers containing Ti, TiN, or TiW, the Al plug, and the interconnection are all formed by the PVD technique.

As the lateral feature size of the semiconductor devices continuously decreases to sub-micron range while the dielectric thickness remains the same, the aspect ratio of contact holes is thus increased, and the step coverage issue for the contact hole becomes a bottleneck as shown in FIG. 1B. FIG. 1A shows a configuration of the conventional PVD process, where the substrate 120 is supported by a chuck 140, and the direction of the deposition from the target 100 is always vertical to the surface of the substrate 120. This conventional PVD method has a limit to its poor step coverage.

An alternative method called ionized metal plasma (IMP) is developed for improving bottom step coverage. Unfortunately, the sidewall step coverage of the IMP has not been improved, and is possibly even worse than the conventional PVD method. The step coverage issue is crucial to modern semiconductor devices and becomes important to some specific processes. For instance, the step coverage of the barrier layer on the contact sidewall is significant for the copper metallization process, in which the barrier layer is mainly used to prevent copper from diffusing into the substrate. Moreover, the step coverage of the copper seed layer is also important for the copper metallization process, in which a too thin seed layer will form unwanted voids after filling in the copper.

According to the foregoing reasons, there is a need for a method of physical vapor deposition with substantially good step coverage on the bottom and the sidewall in the contact holes.

SUMMARY OF THE INVENTION

In accordance with the present invention, a deposition method is provided that substantially improves step coverage of contact holes in the semiconductor substrate. In one embodiment, a semiconductor substrate having some contact holes is initially placed on a chuck of a chamber. The chuck is firstly adjusted and metallic material is firstly deposited onto the substrate, wherein the direction of the first deposition is about vertical to surface of the substrate, and the bottom of the contact holes is then substantially deposited with the metallic material. Next, the chuck is secondly adjusted so that it has a tilt angle of about 0.2–20 degrees between the direction of the second deposition and rotation axis of the chuck. Finally, the chuck is continuously rotated and the metallic material is secondly deposited onto the wafer, so that the sidewall of the contact holes is then substantially deposited with the metallic material, thereby the coverage of the sidewall of the contact holes as well as the bottom of the contact holes are substantially uniform.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
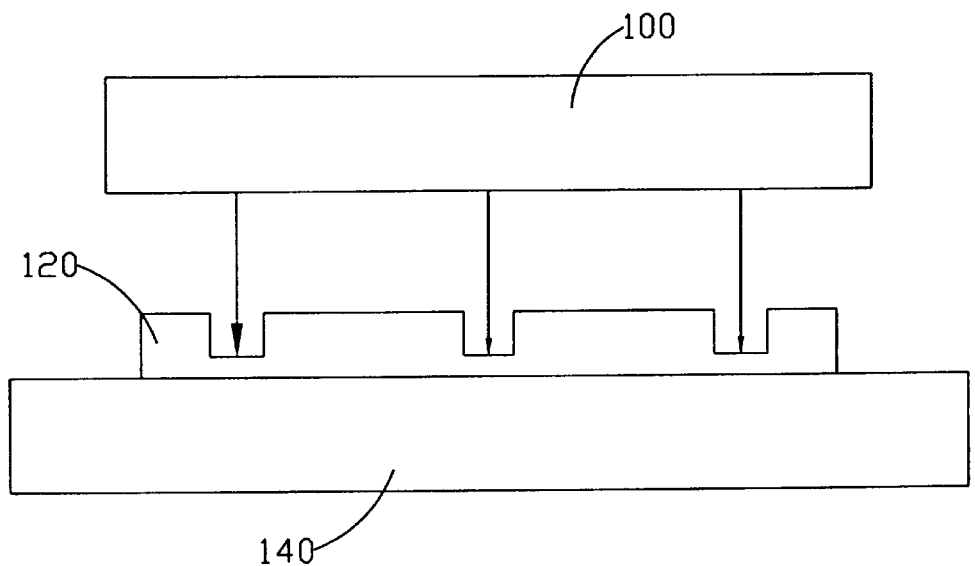
FIG. 1A shows a configuration of the conventional PVD process.
Figure 1B:
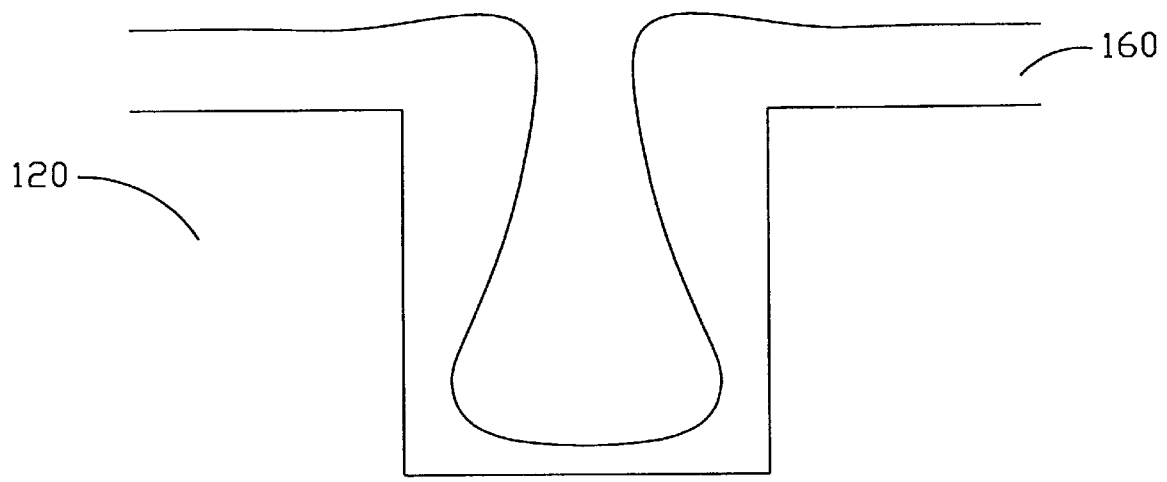
FIG. 1B shows a cross-sectional view illustrative of the step coverage issue in the conventional PVD process.
Figure 2:
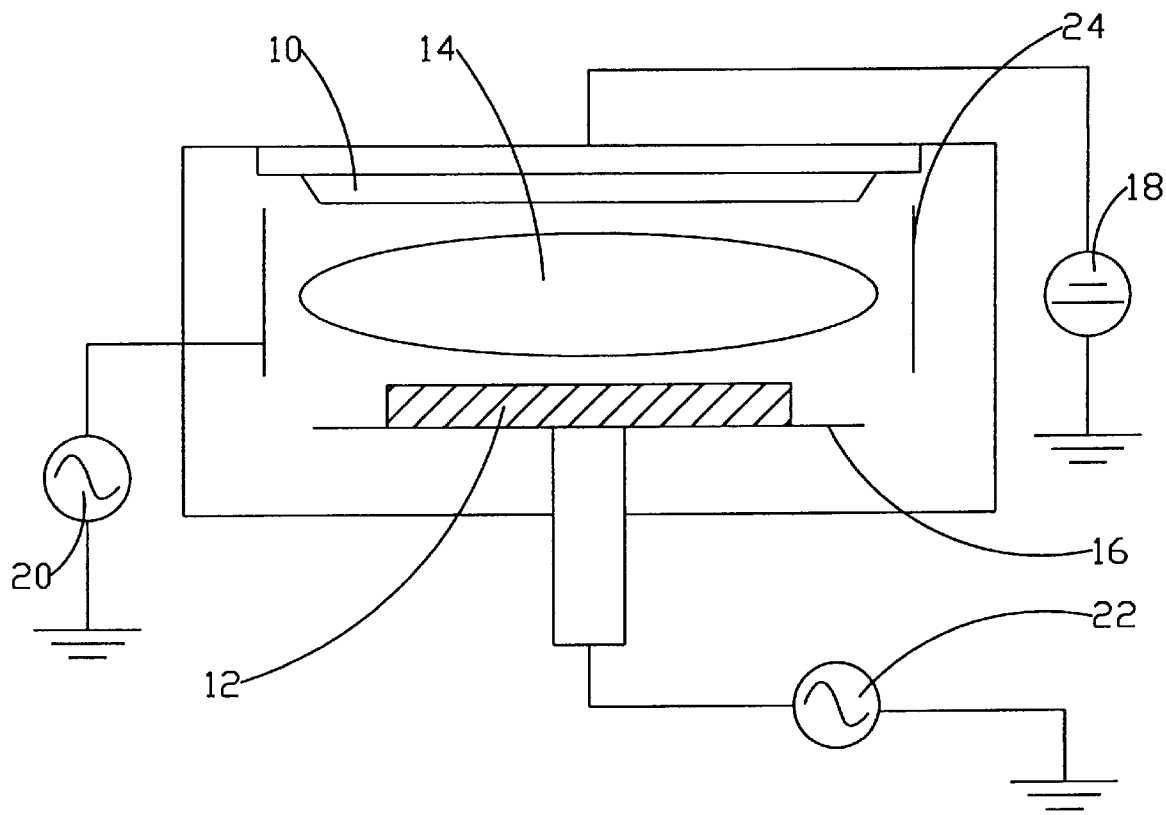
FIG. 2 shows a simplified diagram illustrating an ionized metal plasma (IMP) apparatus used in performing metal deposition in the present embodiment.

FIG. 2 shows a simplified diagram illustrating an ionized metal plasma (IMP) apparatus used in performing metal deposition in the embodiment. The IMP apparatus primarily includes magnetic direct current (DC) power 18, and a radio frequency (RF) alternating current (AC) power 20. The metallic atoms in the metal target 10 are sputtered out powered by the magnetic DC power 18. These sputtered atoms are further accelerated by the RF AC power 20, and then collided with the electron in the IMP chamber, resulting in ionized metallic atoms 14 or plasma, which is finally impinged on the wafer 12 (which is supported by a chuck 16).

Figure 3:
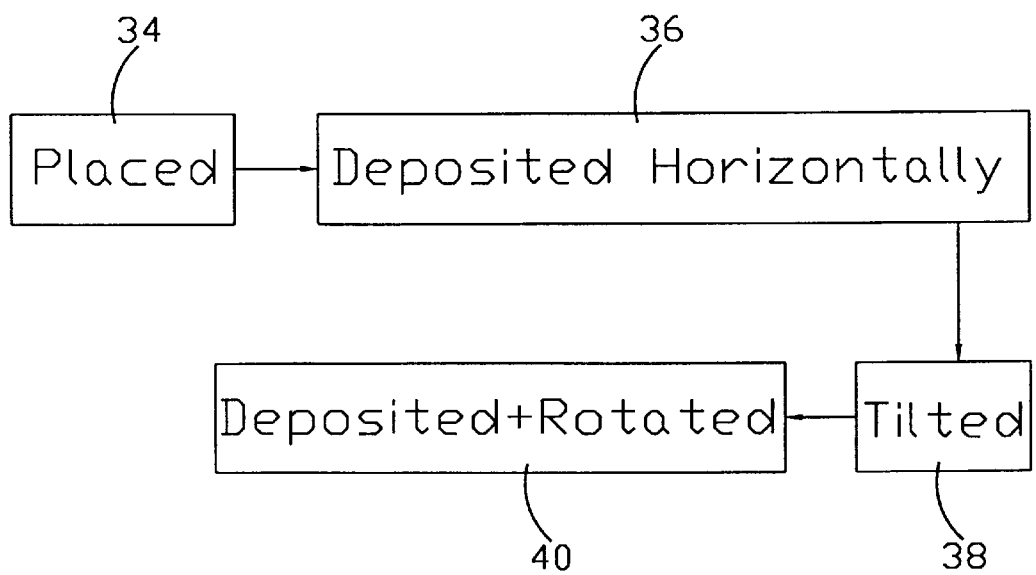
FIG. 3 illustrates a flow according to one embodiment of the present invention.
Figure 5:
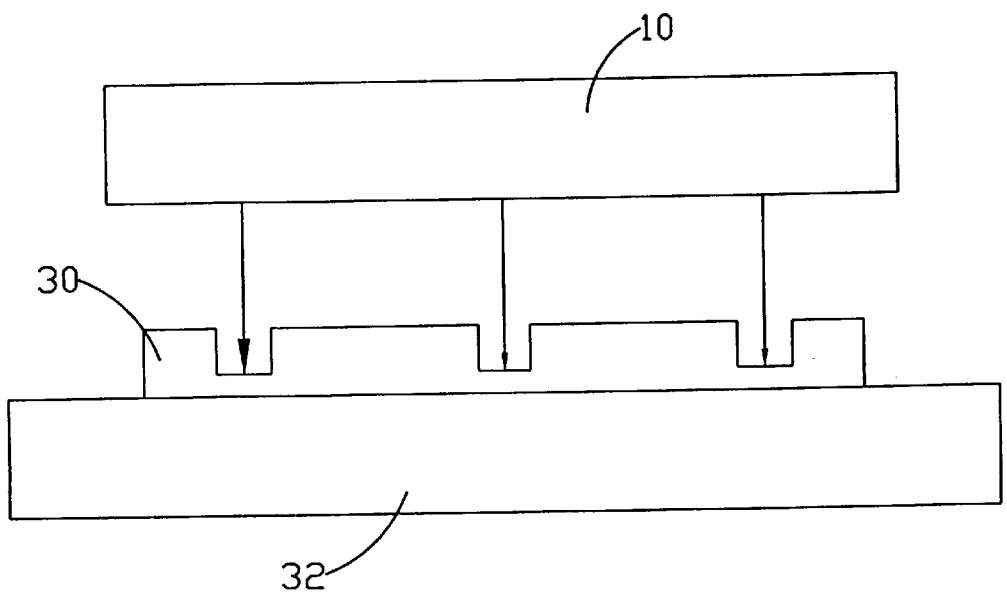
FIGS. 5 to 7 show cross-sectional diagrams illustrating various stages in performing the deposition according to the present invention.

FIG. 3 illustrates a flow according to one embodiment of the present invention. Firstly, a semiconductor substrate 30 (FIG. 5) is placed on a chuck 32 (step 34, FIG. 3) in the IMP apparatus. Generally, the direction of deposition from the metal target 10 is initially vertical to the surface of the substrate 30.

Next, the wafer 30 is deposited with conductive material such as metal. Due to the horizontal configuration of the wafer 30 relative to the target 10, the deposition is primarily performed on the bottom surface of the contact holes in the substrate, while the sidewalls of the contact holes are scarcely deposited.

Figure 6:
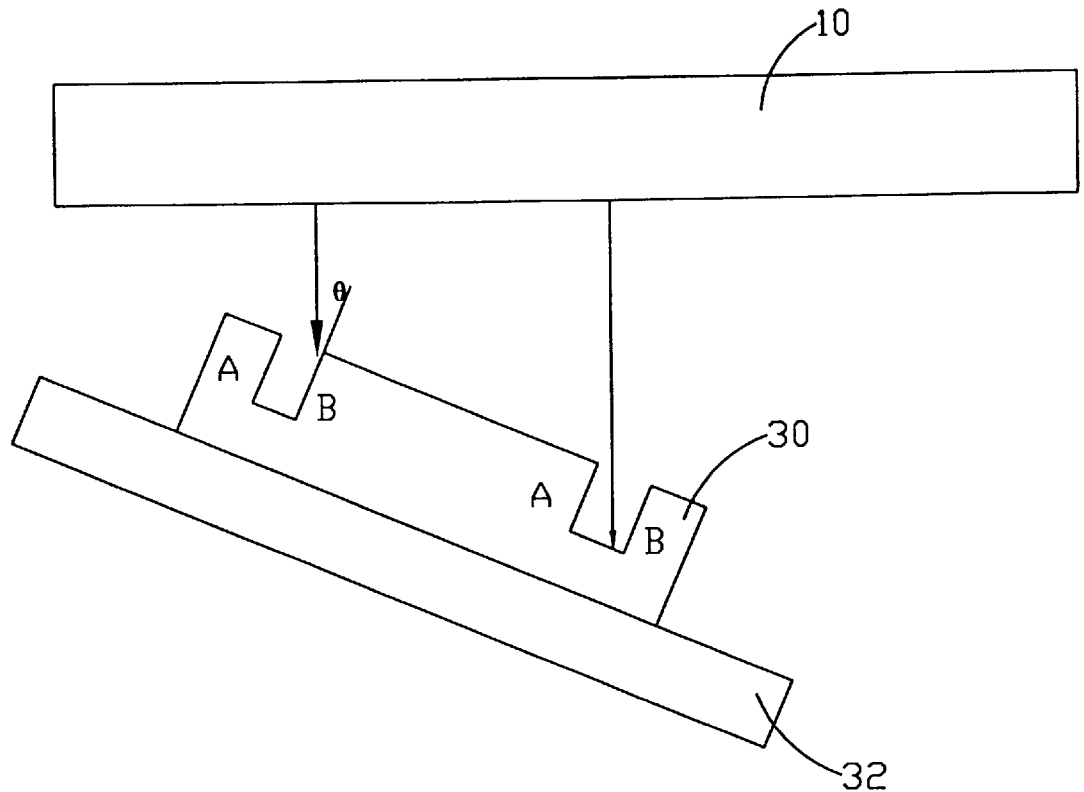

In the subsequent step 38 (FIG. 3), the chuck 32 (and the wafer 30) is adjusted so that the chuck 32 has a tilt angle θ between the direction of the deposition from the target 10 and the (rotation) axis of the chuck 32 as shown in FIG. 6. In this embodiment, the tilt angle is preferably 0.2–20 degrees, while it is appreciated that the choice of the angle depends on the depth of the contact hole in the substrate 30. Generally, a deeper contact hole requires a smaller tilt angle, and vice versa.

Figure 7:
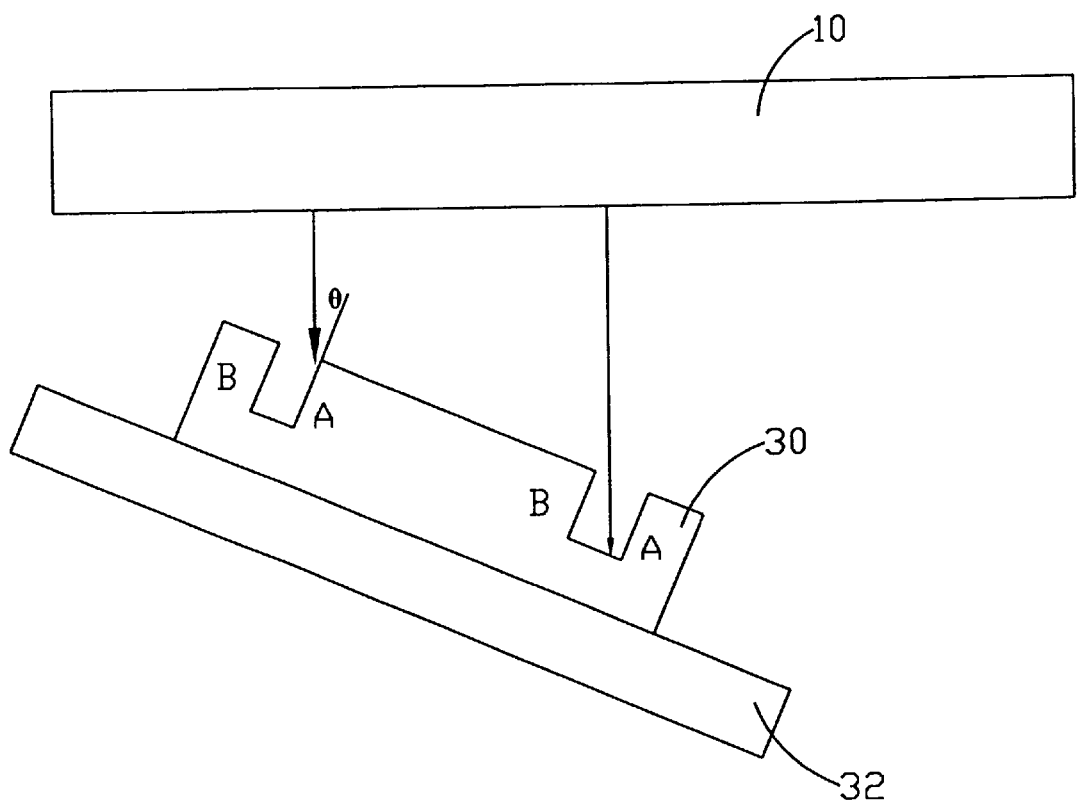

In the final step 40 of FIG. 3, the chuck 32 (and the wafer 30) is continuously rotated while performing deposition. It is appreciated that the direction of the rotation can be clockwise or counterclockwise. Due to the continuous rotation and the tilted substrate 30 relative to the deposition (as shown in FIG. 7), the whole surface of the sidewall of contact holes in the wafer 30 can be uniformly deposited with the metallic material from the target 10.

According to the configuration of the embodiment of the present invention, in addition to the bottom surface of the contact holes, the step coverage of the sidewall of the contact holes can be largely improved.

Figure 4:
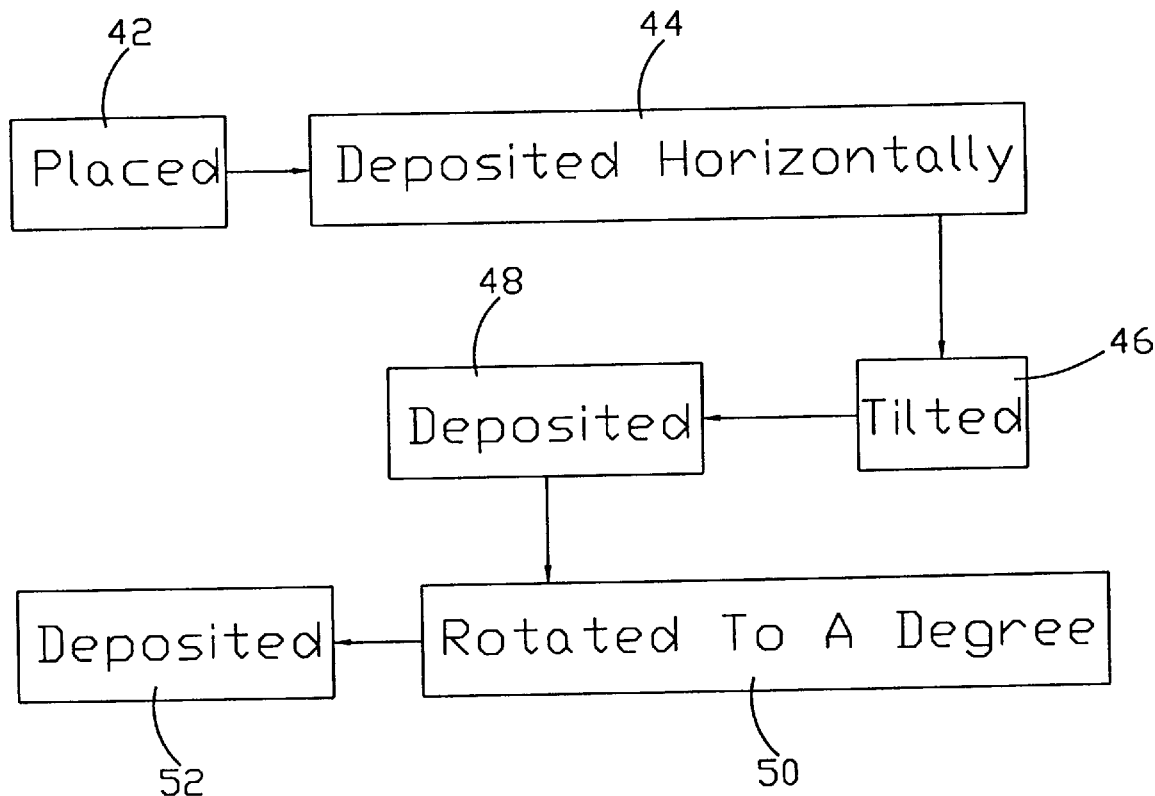
FIG. 4 illustrates a flow according to another embodiment of the present invention.

FIG. 4 shows a flow according to another embodiment of the present invention. The steps 42, 44, and 46 are performed in the same manner as the steps 34, 36, and 38, respectively, in the previous embodiment. During the subsequent step 48, the metallic material is deposited onto a stationery substrate 30 (and the chuck 32). After the deposition is performed for a predetermined time, the chuck 32 is then rotated to a degree, such as 90 or 180 degrees (step 50), followed by another deposition onto the stationery substrate 30 (step 52). The steps 50 and 52 are repeated until the sidewalls of the contact holes in the substrate 30 are uniformly covered with the metallic material to a sufficient thickness.

Figure 8:
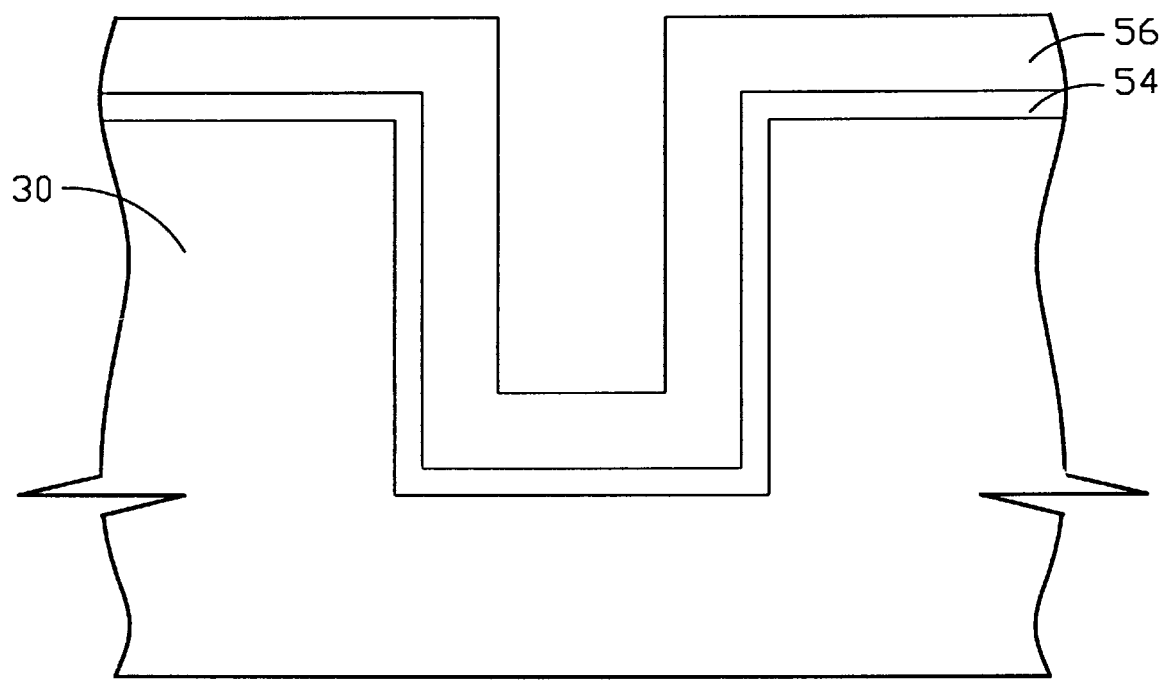
FIG. 8 shows a cross-sectional view demonstrating one example, which utilizes the deposition process according to the present invention.

It is noted that the embodiments described above can be adapted to most of the deposition process, especially to the physical vapor deposition process. The present invention can be performed to deposit a conventional conductive layer onto a semiconductor wafer with contact holes. For example, FIG. 8 shows a cross-sectional view in which a TaN layer 54 is deposited on a substrate 30 using the process of the present invention, and a copper seed layer 56 is then deposited on the TaN layer 54. According to the present invention, the deposited TaN layer 54 and the deposited copper seed layer 56 have better step coverage inside the contact hole as compared to the conventional process.

Although specific embodiments have been illustrated and described, it will be obvious to those skilled in the art that various modifications may be made without departing from what is intended to be limited solely by the appended claims.

What is claimed is:

1. A deposition method, comprising:

placing a semiconductor substrate on a chuck of a chamber, said substrate having a plurality of contact holes;

firstly adjusting said chuck and firstly depositing conductive material onto said substrate, direction of said first deposition being about vertical to surface of said substrate, bottom of said contact holes being then substantially deposited with the conductive material;

secondly adjusting said chuck so that said chuck has a tilt angle between the direction of the second deposition and rotation axis of the chuck; and continuously rotating said chuck and secondly depositing the conductive material onto said substrate, sidewall of said contact holes being then substantially deposited with the conductive material.

2. A deposition method, comprising:

placing a semiconductor substrate on a chuck of a chamber, said substrate having a plurality of contact holes;

firstly adjusting said chuck and firstly depositing conductive material onto said substrate, direction of said first deposition is about vertical to surface of said substrate, bottom of said contact holes being then substantially deposited with the conductive material;

secondly adjusting said chuck so that said chuck has a tilt angle between the direction of the second deposition and rotation axis of the chuck;

secondly depositing the conductive material onto said substrate, a portion of sidewall of said contact holes being then substantially deposited with the conductive material;

rotating the chuck for a degree while maintaining said tilt angle, and thirdly depositing the conductive material onto said substrate, another portion of the sidewall of said contact holes being then substantially deposited with the conductive material; and repeating said rotating the chuck and said third position until all of the sidewall of the contact holes are substantially covered with the conductive material.

3. The method according to claim 2, wherein said degree of the chuck rotation is about 90 degrees.

4. The method according to claim 2, wherein said degree of the chuck rotation is about 180 degrees.

5. The method according to claim 2, wherein said tilt angle is about 0.2–20 degrees.

6. A physical vapor deposition method, comprising:

placing a semiconductor substrate on a chuck of a chamber, said substrate having a plurality of contact holes;

firstly adjusting said chuck and firstly depositing metallic material onto said substrate, direction of said first deposition is about vertical to surface of said substrate, bottom of said contact holes being then substantially deposited with the metallic material;

secondly adjusting said chuck so that said chuck has a tilt angle of about 0.2–20 degrees between the direction of the second deposition and rotation axis of the chuck; and continuously rotating said chuck and secondly depositing the metallic material onto said wafer, sidewall of said contact holes being then substantially deposited with the metallic material, thereby the coverage of the sidewall of the contact holes as well as the bottom of the contact holes being substantially uniform.

7. The method according to claim 6, wherein said chuck is rotated in a clockwise or counterclockwise manner.

* * * * *